(12) United States Patent
Choi et al.

(10) Patent No.: US 6,425,994 B1
(45) Date of Patent: Jul. 30, 2002

(54) PROCESS CHAMBER INCLUDING STAGE HAVING IMPROVED BASE AND SUBSTRATE MOUNTING MEMBER

(75) Inventors: Chang-Hoon Choi; Man-Jong Park; In-Won Lee, all of Kumi-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/433,631

(22) Filed: Nov. 3, 1999

(30) Foreign Application Priority Data

Nov. 4, 1998 (KR) ............................................. 98-47186

(51) Int. Cl.[7] ........................ C23C 14/34; C23C 16/00; C23F 1/02
(52) U.S. Cl. ......................... 204/298.15; 204/298.09; 118/725; 118/728; 118/500; 156/345
(58) Field of Search ..................... 204/298.15, 298.09; 188/728, 500, 725; 156/345

(56) References Cited

U.S. PATENT DOCUMENTS

| 4,771,730 | A | * | 9/1988 | Tezuka ......................... 156/345 |
| 5,203,958 | A | * | 4/1993 | Arai et al. ............... 204/298.15 |
| 5,226,383 | A | * | 7/1993 | Bhat ............................ 118/500 |
| 5,447,595 | A | * | 9/1995 | Nakagawa .................... 118/728 |
| 5,736,818 | A | * | 4/1998 | Ulczynski et al. ...... 204/298.15 |
| 5,812,362 | A | * | 9/1998 | Ravi ............................ 361/234 |
| 5,891,350 | A | * | 4/1999 | Shan et al. .................. 156/345 |
| 5,951,887 | A | * | 9/1999 | Mabuchi et al. ..... 118/723 MW |
| 6,007,635 | A | * | 12/1999 | Mahawili ..................... 118/728 |
| 6,077,353 | A | * | 6/2000 | Al-sharif et al. ............ 118/728 |
| 6,090,212 | A | * | 7/2000 | Mahawili ..................... 118/728 |

FOREIGN PATENT DOCUMENTS

| JP | 53 099 081 A | * | 8/1978 | ............ 204/298.15 |
| JP | 06 020 965 A | * | 1/1994 | ................. 118/728 |
| JP | 06 283 439 A | * | 10/1994 | ................. 118/728 |

* cited by examiner

*Primary Examiner*—Rodney G. McDonald
*Assistant Examiner*—Gregg Cantelmo
(74) *Attorney, Agent, or Firm*—Birch, Stewart, Kolasch & Birch, LLP

(57) ABSTRACT

A process chamber for processing a substrate by conducting plasma enhanced chemical vapor deposition or sputtering includes a stage. The stage has a main base member that is constructed to have projections and a recessed portion between the projections, and a substrate mounting member which is constructred to fit between the projections of the main base member and such that the a portion of the substrate mounting member is located within the recessed portion and a portion of the substrate mounting member protrudes from the main base member. The substrate mounting member is easily removed from the main base member while also being reliably fixed and positioned in the main base member by the projections. As a result of this construction, the substrate mounting member can be removed from the process chamber independently of the main base member and in a manner similar to how the substrate is removed after processing.

7 Claims, 3 Drawing Sheets

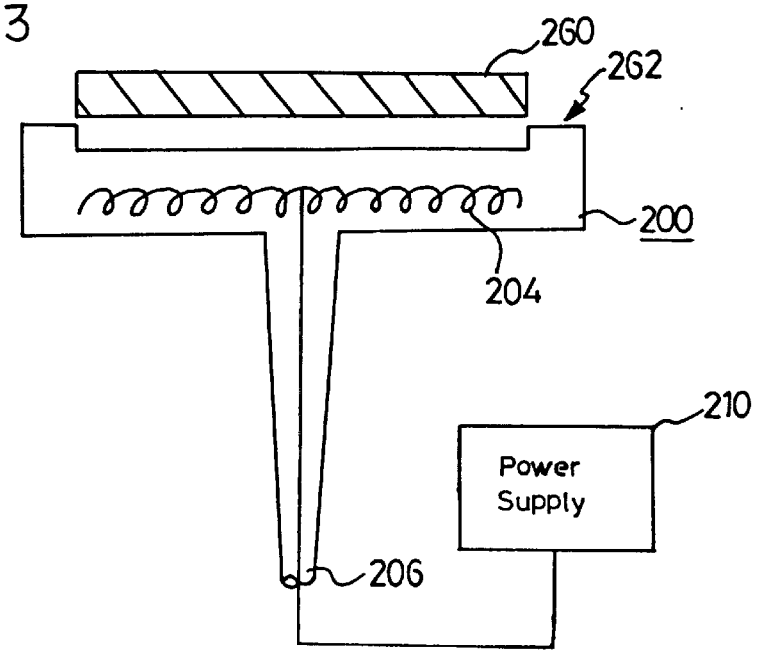
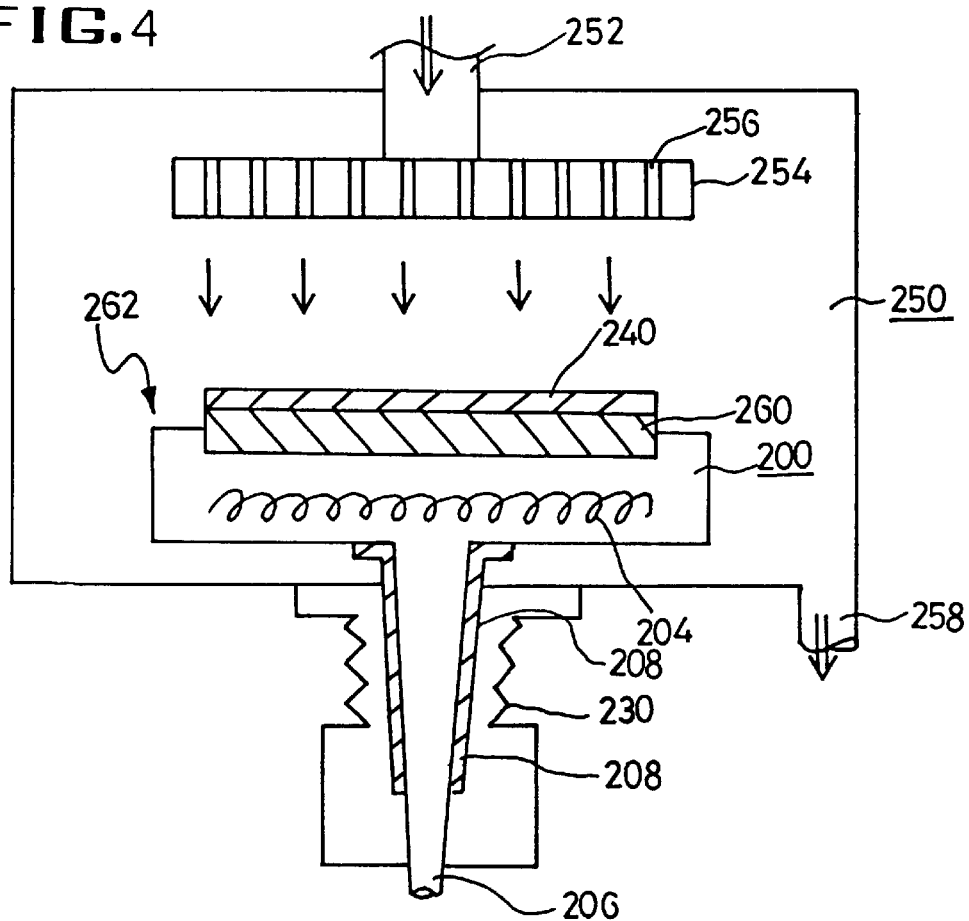

PROCESS CHAMBER INCLUDING STAGE HAVING IMPROVED BASE AND SUBSTRATE MOUNTING MEMBER

BACKGROUND OF THE INVENTION

1. Field of the Invention

The present invention relates to a process chamber and more specifically, a process chamber in which plasma enhanced chemical vapor deposition, sputtering, and other similar processes are performed on a substrate such as glass.

2. Discussion of Related Art

A multitude of general processes such as chemical vapor deposition, sputtering, etching and other similar processes can be carried out in a process chamber, for example, for forming layers of a thin film transistor on a substrate.

In the present description, a thermal process such as annealing is used as an example of a process performed in the process chamber. In a thermal process, a substrate that is disposed on a stage has heat transferred to the substrate via a heating coil that transforms electric energy into thermal energy. The heating coil heats the substrate so as to maintain a temperature that can accelerate the reaction between the substrate and process gases flowing in the process chamber.

FIG. 1 is a cross-sectional view of a stage according to the related art. FIG. 2 is a cross-sectional view of a process chamber including the stage shown in FIG. 1.

The stage shown in FIGS. 1 and 2 is a unitary, integral member including both a main base portion 100 and a substrate mounting portion 160.

Referring to FIG. 1 and FIG. 2, a stage is installed at the lower portion of the process chamber. The stage includes the main base portion 100, the substrate mounting portion 160, a heating coil 104, and a power supply 110.

The substrate mounting portion 160 protrudes upward and is located at the top part of the base portion 100. The base portion 100 also includes a built-in heating coil 104. The power supply 110 connects to the heating coil 104 so that by supplying the heating coil 104 with electric current, the heating coil 104 can transform electric energy to thermal energy.

Thus, the base portion 100 and the substrate mounting portion 160 define a unitary stage according to the related art.

Note that recesses on either side of the related art substrate mounting portion 160 are provided to accommodate fixing members (not shown) such as a fixing jig referred to as a "shadow frame" to hold a substrate 140 on the substrate mounting portion 160.

When a substrate 140 is to be processed in the chamber, the substrate 140 is placed on the substrate mounting portion 160 and securing the shadow frames to the recesses at ends of the substrate mounting portion 160 to hold the substrate 140 in place on the substrate mounting portion 160 during the thermal processing in the chamber.

The substrate mounting portion 160 is usually made of aluminum, but can also be made of ceramic or quartz. The substrate mounting portion 160 is usually made of aluminum because quartz and ceramic are much more expensive materials and damaged easily because they react with F radical of process gas.

Also, because ceramic is lower heat conductivity than aluminum, it takes long time to heat ceramic.

So, they are The substrate mounting portion 160 made of aluminum requires an insulating layer disposed between the substrate mounting portion and the substrate in order to protect the substrate and to prevent the aluminum material from conducting current from the aluminum to the substrate thereby causing damage to TFT layers (not shown) later formed on the substrate during processing in the chamber.

A bellows 130 is placed at the exterior lower surface of the process chamber 150 so that the base portion 100 and the process chamber 150 is sealed. A support 106 includes a shaft 108 that rises or falls so as to maintain a proper distance between the substrate 140 and a gas emitting gas diffuser 154. Note that the gas diffuser 154 has a plurality of holes 156 so that gas from the gas supply 152 can be injected into the process chamber 150. Further, an outlet 158 exists at the bottom of the process chamber 150.

Process gas from the gas supply 152 is injected into the inner cavity of the process chamber 150 through the plurality of holes 156 defined in the gas diffuser 154. Note that the process gas turns into a plasma due to the RF power. A semiconductor layer (not shown) is formed on the substrate 140 as a result of the reaction of the process gas, in the plasma state, with the substrate 140. Note that to form the semiconductor layer, the substrate 140 has been mounted on the substrate mounting portion 160 and has been heated by the heating coil 104 to a temperature that is suitable for deposition of a film. Thereafter, the by-products from the thermal process are exhausted through the outlet 158.

Next, a related art process for maintaining a desired substrate temperature that is required for the above-described thermal process will be explained below.

The substrate 140 is placed on the substrate mounting portion 160 by a transporting unit(not shown in the drawing) such as a robot arm or other similar devices. Also, the proper distance between the gas diffuser 154 and the substrate 140 in the process chamber 150 is accomplished by having the shaft 108 rise or fall as needed for accurate positioning. Next, when the power supply 110 is turned on, the heat generated from the heating coil 104 conducts to the substrate mounting portion 160 and the substrate 140 disposed thereon, thus setting the proper temperature for the thermal process.

However, in the related art, the thermal process exposes the substrate mounting portion 160 to heat and gases that damage and contaminate the substrate mounting portion 160, and especially the surface protecting layer that is between the substrate mounting portion 160 and the substrate 140, if the substrate mounting portion is made of aluminum. If the substrate mounting portion 160 is made of quartz or ceramic, the substrate mounting portion 160 is also damaged by the heat and gases because quartz and ceramic materials react with F radical of process gas and ceramic is low heat conductivity.

Because the base portion 100 and the substrate mounting portion 160 define a major portion of a unitary stage, the whole stage must be replaced even though only the surface protecting layer or the substrate mounting portion 160 is damaged. The stage must also be replaced periodically with a new stage by opening the process chamber and then removing the stage from the chamber.

Further, the new stage needs to be set up again, thus consuming a large amount of process time and incurring additional costs.

SUMMARY OF THE INVENTION

To solve the problems described above, preferred embodiments of the present invention provide a process chamber that allows easy replacement of the substrate mounting member without having to replace the entire stage. Also, the present invention eliminates waste of process time and is constructed to allow very easy and quick replacement of a substrate mounting member.

One preferred embodiment of the present invention provides a process chamber including a main base, a substrate mounting member mounted on the main base and having a substrate mounted thereon, wherein the substrate mounting member is arranged to allow removal of the substrate mounting member.

Another preferred embodiment of the present invention provides a process chamber including a main base including a recessed portion and a protrusion at each of opposite ends thereof, a substrate mounting member mounted on the main base and arranged such that a portion of the substrate mounting member is disposed within the recessed portion of the main base and between the protrusions at the opposite ends of the main base.

Another preferred embodiment of the present invention provides a process chamber which preferably includes a main base, and a substrate mounting member which is independent of the main base and removably mounted on the main base, and arranged to support a substrate during processing.

In preferred embodiments of the present invention, the substrate mounting member may have a plurality of different shapes and configurations. Regardless of such different shapes, the substrate mounting member and the main base are constructed such that the shape of a portion of the mounting member mates with and correspondes to a shape of a top surface of the main base. Other features, elements, characteristics and advantages of the present invention will become more apparent from the following detailed description of preferred embodiments of the present invention with reference to the attached drawings.

BRIEF DESCRIPTION OF THE ATTACHED DRAWINGS

The accompanying drawings, which are included to provide a better understanding of the invention and are incorporated in and constitute a part of this application, illustrate preferred embodiments of the present invention and together with the description are used to explain the principles, features, elements of the present invention.

FIG. 3 is a cross-sectional view of a separable stage according to a preferred embodiment of the present invention;

FIG. 4 is a cross-sectional view of a process chamber including the preferred embodiment of FIG. 3.

DETAILED DESCRIPTION OF PREFERRED EMBODIMENTS

Figure 1:
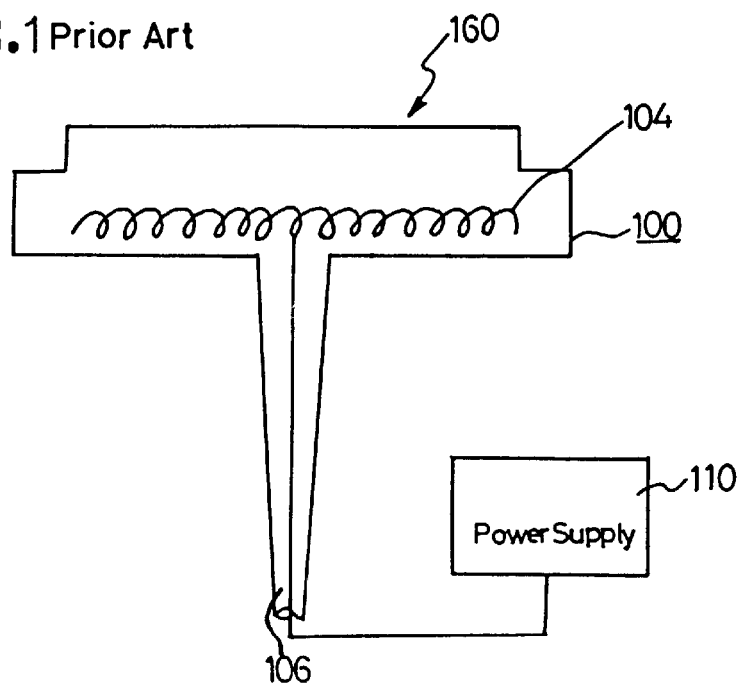
FIG. 1 is a cross-sectional view of a unitary stage according to a related art.

FIG. 3 is a cross-sectional view of an improved stage according to a preferred embodiment of the present invention. FIG. 4 is a cross-sectional view of a process chamber including an improved stage of the preferred embodiment as shown in FIG. 3.

Referring to FIG. 3 and FIG. 4, a stage of a process chamber of preferred embodiments of the present invention includes a main base 200 having protrusions 262 at opposite ends thereof and defining a recessed portion, a substrate mounting member 260, a heating coil 204, and a power supply 210.

The protrusions 262 are disposed at opposite edges of an upper surface of the main base 200, which includes the built-in heating coil 204. The protrusions 262 are arranged to define a recessed portion therebetween. The power supply 210 is electrically connected to the heating coil 204 so that the heating coil 204 is heated via the electric current generated by the power supply 210.

The substrate mounting member 260 is constructed to mate with the main base 200. More specifically, a portion of a surface of the substrate mounting member 260 has a shape that mates with and correspondes to the shape of the recessed portion or the portion of the main base 200 located between the protrusions 262.

As seen in FIG. 4, the protrusions 262 fix the substrate mounting member 260 reliably and accurately on the main base 200 so that there is no problem in the positioning the substrate mounting member 260, and thus, no problem with misalignment or non-uniformity of the layers to be formed on the substrate 240 mounted on the substrate mounting member 260.

In one example of preferred embodiments of the present invention, the substrate mounting member 260 preferably has a thickness preferably in the range of about 5.0 mm to about 5.5 mm. The substrate mounting member 260 can be made of, for example, quartz, alumina, ceramic or etc.

The substrate mounting member 260 is placed in the space defined between the protrusions 262. The substrate mounting member 260 preferably has a thickness that is greater than that of the protrusions 262 and the base member 200 so that the substrate mounting member 260 protrudes beyond (g) protrusions 262 and the base member 200.

Figure 5:
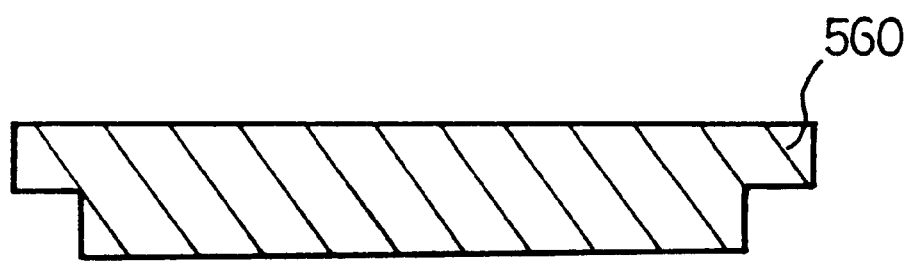
FIG. 5 is a preferred embodiment of a substrate mounting member of the present invention.

Note that the substrate mounting member 260 can have any shape that allows the substrate mounting member 260 to be mated with the base member 200 so that the substrate mounting member 260 is fixed and reliably positioned on the base member 200, such as, being inserted in the inner space defined between the protrusion 262. For example, the substrate mounting member 260 may have a 'T' shape as shown in FIG. 5 as well as a flat shape as shown in FIG. 3. Laterally protruding portions of the substantially 'T' shaped substrate mounting member 260 are placed on the protrusions 262. Other shapes of the substrate mounting member 260 are also possible.

In preferred embodiments, the stage preferably includes the main base 200 and the substrate mounting member 260 that is independent from and removably mounted on the main base 200.

In certain preferred embodiments, the substantially T-shaped substrate mounting member 560 is preferred because the substantially T-shaped configuration provides an additional measure of protection from the damage caused by the gas or heat during processing which would otherwise occur at edges of the base 200 and edges of the substrate mounting member 260.

The stage of the present preferred embodiment, as shown in FIG. 4., is installed at the lower portion of the process chamber 250.

A support 206 is equipped with a shaft 208 which rises or falls to maintain proper spacing between the substrate mounting member 260 and a gas diffuser 254. A bellows 230 is installed at the exterior bottom surface of the process chamber 250 to seal the base 200 and the process chamber 250.

A gas supply 252 supplies the gas diffuser 254 with gas so that the gas is injected into the process chamber 250 through the plurality of holes 256 that are defined in the gas diffuser 254. The gas diffuser 254 is installed at the upper portion of the process chamber 250. An outlet 258 is provided at the lower right and left portions of the process chamber 250.

When a process gas supplied from the gas supply 252 is injected into an inner cavity of the process chamber 250 through a plurality of holes 256 defined at the gas diffuser 254, the process gas becomes a plasma due to the RF power. A semiconductor layer (not shown in the drawing) for a thin film transistor is deposited by reacting the process gas in the plasma state with a substrate 240.

In preferred embodiments of the present invention, the substrate 240 is mounted on the substrate mounting member 260 of the stage and is heated by the hot coil 204 to a temperature that is suitable for depositing a film. Thereafter, by-products of the process reaction are exhausted through the outlet 258

Next, a process for setting the desired temperature for the thermal process for the stage of preferred embodiments of the present invention will be explained below.

After the substrate mounting member 260 is inserted into the inner space provided by the protrusions 262 on the upper surface of the main base 200, the substrate 240 is placed on the substrate mounting member 260 via a transporting unit (not shown in the drawing) such as a robot arm or other similar device.

Thereafter, a proper distance between the gas diffuser 254 and the substrate mounting member 260 in the process chamber 250 is set by having the shaft 208 rise or fall as needed. Next, by turning on the power supply 210, heat is generated from the heating coil 204 and is conducted to the substrate mounting member 260 and the substrate 240 deposited thereon. Note that the proper temperature for the thermal process is controlled by a temperature controller not shown in the drawings.

During the above-described thermal process, the substrate mounting member 260 is exposed to heat and gases so that the mounting member 260 may be damaged and contaminated. Further, a surface protecting layer of the substrate mounting member 260, if used, will also be damaged by the heat and gases.

Therefore, the damaged substrate mounting member 260 should be replaced periodically by removing the mounting member 260 from the base 200 and from the process chamber. The substrate mounting member 260 is replaced by lowering the internal temperature by turning off the power supply 210, by opening the process chamber 250, by ejecting the damaged substrate mounting member 260 from the inner space between the protrusions 262, and by inserting a new prepared substrate mounting member 260 into the inner space between the protrusions 262.

Figure 2:
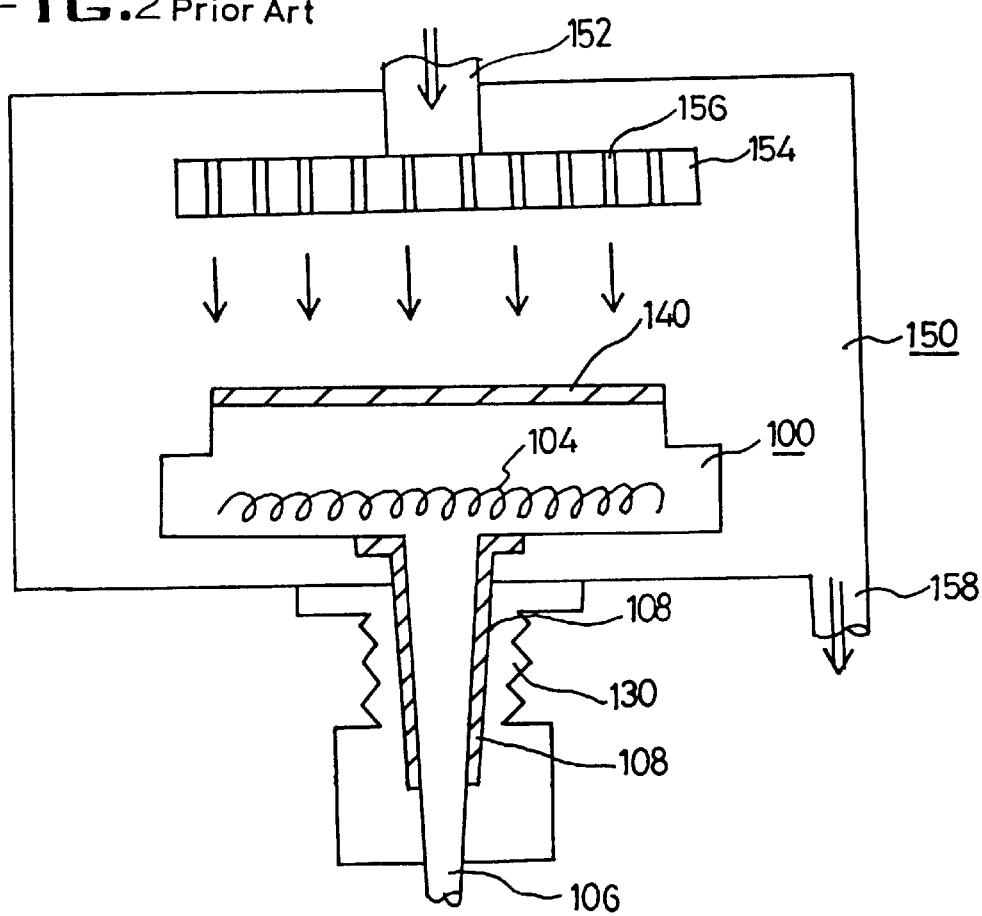
FIG. 2 is a cross-sectional view of a process chamber including the stage of FIG. 1.

As mentioned previously, preferred embodiments of the present invention allow for easy and quick replacement of the damaged substrate mounting member 260 from the base 200, and in a manner that is similar to how the processed substrate 240 is removed from the process chamber. More specifically, as seen in FIG. 2, the related art device requires that the stage be removed from a rear or bottom portion of the process chamber and that the entire stage be removed from the process chamber. In contrast, in preferred embodiments of the present invention. In the whole stage is not required to be removed from the process chamber each time a substrate mounting member or insulating film must be replaced. Instead, only the substrate mounting member can be removed by the transporting unit such as a robot arm and taken out of the process chamber to through the side or upper portion thereof, similar to how a substrate is removed from the process chamber.

Accordingly, a substrate mounting member 260 that is damaged by heat or gases can be easily replaced since the substrate mounting member is separable from the base. Thus, the time consumed in dismantling and assembling a whole new process chamber to replace the damaged substrate mounting member as well as the costs associated with losing time for performing manufacturing processes is greatly reduced.

Moreover, preferred embodiments of the present invention has a structure such that the surface of the substrate mounting member projects out from a plane defined by the main base and the protrusions at the opposite ends thereof so that the substrate mounting member can be easily fixed in or removed from the inner space or recessed portion between the protrusions of the main base. The protrusions of the main base and the corresponding structure of the substrate mounting member makes it much easier to take the damaged substrate mounting member out of the process chamber because the mounting member the film can be removed in the same way that the substrate is removed. It will be apparent to those skilled in the art that various modifications and variations can be made in a process chamber of the present invention without departing from the spirit or scope of the inventions.

What is claimed is:

1. A process chamber comprising:
    a main base including a recessed portion, a protrusion at each of opposite ends thereof, and a heating coil arranged to transfer heat to a substrate mounting member, the heating coil being disposed within the main base; and
    the substrate mounting member mounted on the main base and arranged such that a portion of the substrate mounting member is disposed within the recessed portion of the main base and between the protrusions at the opposite ends of the main base,
    wherein the substrate mounting member is fixed to the main base via a force fit.

2. The process chamber according to claim 1, further comprising a power supply connected electrically to the heating coil.

3. The process chamber according to claim 1, wherein the substrate mounting member is made of one quartz, ceramic and alumina.

4. The process chamber according to claim 1, wherein the substrate mounting member has a portion that projects from a surface defined by the protrusions and the recessed portion of the main base.

5. The process chamber according to claim 1, wherein the substrate mounting member has a length that is substantially equal to a length of the recessed portion of the main base.

6. The process chamber according to claim 1, wherein the substrate mounting member includes laterally projecting members disposed on the protrusions of the main base.

7. The process chamber according to claim 1, wherein the substrate mounting member has a substantially T-shaped configuration.

* * * * *